(12) United States Patent
Ellä et al.

(10) Patent No.: US 10,326,428 B2
(45) Date of Patent: Jun. 18, 2019

(54) TUNABLE ELECTROACOUSTIC RF FILTER WITH IMPROVED ELECTRIC PROPERTIES AND METHOD FOR OPERATING SUCH A FILTER

(71) Applicant: Snaptrack Inc., San Diego, CA (US)

(72) Inventors: Juha Ellä, Halikko (FI); Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 259 days.

(21) Appl. No.: 15/117,390

(22) PCT Filed: May 30, 2014

(86) PCT No.: PCT/EP2014/061261
§ 371 (c)(1),
(2) Date: Aug. 8, 2016

(87) PCT Pub. No.: WO2015/128003
PCT Pub. Date: Sep. 3, 2015

(65) Prior Publication Data
US 2016/0359469 A1    Dec. 8, 2016

(30) Foreign Application Priority Data
Feb. 28, 2014    (DE) .................. 10 2014 102 707

(51) Int. Cl.
*H03F 3/20*    (2006.01)
*H03H 7/38*    (2006.01)
(Continued)

(52) U.S. Cl.
CPC ............. *H03H 9/46* (2013.01); *H03F 3/20* (2013.01); *H03H 7/38* (2013.01); *H03H 9/542* (2013.01);
(Continued)

(58) Field of Classification Search
CPC ...... H03H 7/38; H03H 2007/386; H03H 7/40; H03H 7/46; H03H 7/461; H03H 7/463;
(Continued)

(56) References Cited

U.S. PATENT DOCUMENTS 5,051,711 A    9/1991   Jones
5,216,392 A    6/1993   Fraser
(Continued)

FOREIGN PATENT DOCUMENTS

DE    102 02 475 A1 *   8/2003
DE    102007021581 A1   11/2008
(Continued)

OTHER PUBLICATIONS

International Search Report and Written Opinion—PCT/EP2014/061261—ISA/EPO—dated Nov. 11, 2014.

*Primary Examiner* — Barbara Summons
(74) *Attorney, Agent, or Firm* — Patterson & Sheridan, L.L.P. Qualcomm

(57) ABSTRACT

The invention specifies a tunable RF filter which may operate using electroacoustic components and provides good electrical properties despite having a wide tuning range. For this purpose, the RF filter comprises a tunable filter core (AFK) having electroacoustic (EAK) and detunable (AKE) filter elements, and impedance restoration circuits (IWS1, IWS2) for compensating for an impedance change by tuning the filter core.

14 Claims, 6 Drawing Sheets

(51) Int. Cl.
*H03H 9/02* (2006.01)
*H03H 9/46* (2006.01)
*H03H 9/54* (2006.01)
*H03H 9/56* (2006.01)
*H03H 9/60* (2006.01)
*H03H 9/64* (2006.01)
*H03H 9/70* (2006.01)

(52) U.S. Cl.
CPC ............ *H03H 9/568* (2013.01); *H03H 9/605* (2013.01); *H03H 9/64* (2013.01); *H03H 9/6483* (2013.01); *H03F 2200/294* (2013.01); *H03H 9/70* (2013.01); *H03H 2009/02165* (2013.01); *H03H 2009/02204* (2013.01); *H03H 2210/025* (2013.01)

(58) Field of Classification Search
CPC ........ H03H 7/466; H03H 9/0004; H03H 9/46; H03H 9/542; H03H 9/568; H03H 9/605; H03H 9/64; H03H 9/6403; H03H 9/6483; H03H 9/70; H03H 9/706; H03H 9/725; H03H 2009/02165; H03H 2009/02204; H03H 2210/025; H03H 2210/01; H03H 2210/012; H03H 2210/015; H03F 3/20; H03F 3/24; H03F 2200/294; H03F 2200/222; H03F 3/191
USPC .................. 333/133, 189, 193, 195; 330/305
See application file for complete search history.

(56) References Cited

U.S. PATENT DOCUMENTS

| | | | | |
|---|---|---|---|---|
| 5,917,387 | A * | 6/1999 | Rice | ..................... H03H 7/0115 333/174 |
| 5,987,314 | A | 11/1999 | Saito | |
| 6,426,683 | B1 | 7/2002 | Gu | |
| 6,553,216 | B1 * | 4/2003 | Pugel | ..................... H03D 7/18 455/195.1 |
| 8,145,141 | B2 | 3/2012 | Toncich et al. | |
| 9,374,127 | B2 * | 6/2016 | Lehtinen | ................... H04B 1/54 |
| 2004/0127178 | A1 * | 7/2004 | Kuffner | ..................... H01P 1/15 455/133 |
| 2005/0212612 | A1 | 9/2005 | Kawakubo | |
| 2009/0066443 | A1 * | 3/2009 | Kawai | ................ H01P 1/20381 333/101 |
| 2011/0298535 | A1 * | 12/2011 | Van Rijs | ................ H03F 1/0222 330/53 |
| 2012/0007666 | A1 * | 1/2012 | David | ................ H03H 9/02031 327/552 |
| 2012/0098616 | A1 | 4/2012 | Kawai | |
| 2012/0169565 | A1 * | 7/2012 | Morris, III | .............. H03F 1/565 343/860 |
| 2012/0286900 | A1 | 11/2012 | Kadota | |
| 2012/0313731 | A1 | 12/2012 | Burgener | |
| 2013/0127561 | A1 * | 5/2013 | du Toit | ..................... H01P 5/04 333/17.3 |
| 2015/0009079 | A1 * | 1/2015 | Bojer | ..................... H01Q 9/145 343/745 |
| 2017/0012651 | A1 * | 1/2017 | Ella | ........................ H03H 7/465 |
| 2017/0040966 | A1 * | 2/2017 | Ella | ........................ H03H 7/0115 |
| 2017/0077983 | A1 * | 3/2017 | Ella | ........................ H03H 7/465 |

FOREIGN PATENT DOCUMENTS

| | | |
|---|---|---|
| DE | 102010011649 A1 | 9/2011 |
| JP | 07-115340 A * | 5/1995 |
| JP | 08-130493 A * | 5/1996 |
| JP | H0998056 A | 4/1997 |
| JP | 2004-048326 A * | 2/2004 |
| JP | 2004289632 A | 10/2004 |
| JP | 2005217852 A | 8/2005 |
| JP | 2009071343 A | 4/2009 |
| JP | 2009130831 A | 6/2009 |
| WO | WO 02/084686 A1 | 10/2002 |
| WO | WO-2006052766 A1 | 5/2006 |
| WO | WO 2012/114930 A1 | 8/2012 |

* cited by examiner

TUNABLE ELECTROACOUSTIC RF FILTER WITH IMPROVED ELECTRIC PROPERTIES AND METHOD FOR OPERATING SUCH A FILTER

CROSS-REFERENCE TO RELATED APPLICATIONS

This application is a U.S. National Stage of International Application No. PCT/EP2014/061261, filed on May 30, 2014, entitled "Tunable Electroacoustic HF Filter With Improved Electric Properties And Method For Operating Said Type of Filter," which claims the benefit of Germany Patent Application No. 102014102707.8, filed on Feb. 28, 2014, both of which are incorporated herein by reference in their entireties.

The invention relates to radio-frequency (RF) filters which due to their suitability of being tuned with respect to frequency can replace a multiplicity of conventional filters, e.g. in mobile communication devices.

In communication devices which are not cable-connected, e.g. cell phones, WLAN routers, base stations etc., RF filters are used for separating wanted signals from unwanted signals.

Such RF filters typically operate with electroacoustic components in which the frequency position is predetermined by characteristic distances of oppositely polarized electrodes and the speed of propagation of acoustic waves in a medium between them.

The ever increasing number of frequency bands which a device is expected to handle would require an ever increasing number of RF filters. The increasing demands on electrical characteristics such as selectivity or insulation require new technical concepts, in particular, since steeper pass band edges become necessary due to the frequency bands moving closer together.

Thus, tunable electroacoustic filters are known, e.g., from printed documents US 2012/0313731 A1, US 2012/286900 A1 or WO 2012/114930 A1. In these, a capacitive element connected in parallel with an electroacoustic resonator detunes the acoustics in such a manner that, as a consequence, a center frequency of a frequency band is displaced. Due to the fact that the capacitive elements connected in parallel can be tuned in their capacity, the center frequency can be set in a specific frequency interval.

The problem with known tunable RF filters with electroacoustic components is that precise tuning of many parameters, interacting in a complex manner, of the components is necessary for obtaining filters having good electric properties. Any change in the capacity values of the capacitive elements interconnected in parallel therefore results in disadvantageous detuning of the acoustics and an impairment of the filter characteristics. Even if a certain degree of impairment can be tolerated, the tuning range of the known tunable filters is rather small.

It is an object of the present invention, therefore, to specify tunable RF filters which have improved electrical characteristics with enlarged tuning range. Furthermore, it is specified how such a filter is to be operated in order to obtain a wide tuning range with good electrical characteristics. Dependent claims specify advantageous embodiments of the filter.

In this context, a tunable RF filter comprises a filter input and a filter output. The filter also comprises a tunable filter core with an input, an input impedance, an output and electroacoustic filter elements between the input and the output. The filter also comprises a first impedance restoration circuit between the filter input and the input of the filter core. The impedance restoration circuit is suitable and provided for compensating for an impedance change, induced by tuning the tunable filter core, of the input impedance of the filter core.

The filter thus comprises a first impedance restoration circuit for compensating for an impedance change of the input impedance of the filter core. It is also possible to compensate for an impedance change of the output impedance of the filter core.

The tunable RF filter then comprises a filter input and a filter output, a tunable filter core with an input, an output and an output impedance and electroacoustic filter elements between the input and the output. The filter then also comprises a second impedance restoration circuit between the output of the filter core and the filter output. The impedance restoration circuit is suitable and provided for compensating for an impedance change, induced by tuning the tunable filter core, of the output impedance of the filter core.

As part of the investigations relating to tunable RF filters, it was found out that the actual filter, namely the tunable filter core of the present filter, has varying input and output impedances, the variations of the impedance being induced by the tuning of the filter. The most harmful effects of the tuning thus consists in that the filter—as seen from the outside—presents variable input and output impedances so that the integration into an external circuit environment is severely impeded.

In this context, the tunable filter core of the tunable RF filter is the filter segment which essentially leads to the frequency-selective behavior of the filter and fulfils this filter function. The first and second impedance restoration circuit, respectively, then compensates for a change in the input and output impedance of this filter core, respectively, so that an external circuit environment always "sees" constant impedance values. If the tunable RF filter has a defined input and output impedance, respectively, demanded by an external circuit environment, the first and second impedance restoration circuits, respectively, act as impedance matching circuit or as impedance transformation circuit between the peripheral terminals of the RF filter and the filter core. Impedance matching is obtained if only a relatively small jump in impedance is to be compensated for. If the jump in impedance between the terminal of the filter core and the corresponding terminal of the filter is greater, this is called an impedance transformation. A possible definition can be that in the case of a jump in impedance of a factor of <1.5, impedance matching is to be assumed whereas in the case of a jump in impedance by a factor of ≥1.5, an impedance transformation is to be assumed. The two impedance restoration circuits generally in this case manage an impedance matching or a transformation for factors of up to about 1.5, 5, 10, 20 or more so that large impedance changes at the peripheral terminals of the core can be compensated for. As a result, the present RF filter can have a very wide tuning range with very good electrical filter characteristics, at the same time.

The conceptual distinction between filter core and impedance restoration circuits is based on the fundamentally different effects of the corresponding filter sections: the filter core produces the frequency selection whereas the impedance restoration circuits implement virtually no filtering effect but, instead, an impedance transformation or matching functionality efficiently, i.e. with relatively few circuit components.

The electroacoustic component can then be an individual resonator or a combination, e.g. a series interconnection or a parallel interconnection of electroacoustic resonators. Electroacoustic resonators considered are SAW resonators (SAW=Surface Acoustic Wave), BAW resonators (BAW=Bulk Acoustic Wave), GBAW resonators (GBAW=Guided Bulk Acoustic Wave) or combinations of such resonators.

The RF filter can thus comprise exactly one impedance restoration circuit. This can be arranged either between the filter input and the tunable filter core or, on the other hand, between the tunable filter core and the output of the RF filter.

However, it is rather improbable that tuning the tunable filter core only changes the input impedance or only the output impedance of the filter core. It is much more probable that both the input impedance of the filter core and the output impedance of the filter core are changed by tuning the frequency. It is, therefore, generally an advantageous embodiment of the RF filter to provide both the first impedance restoration circuit and the second impedance restoration circuit between the corresponding inputs and outputs of the RF filter and the tunable filter core.

A corresponding RF filter can then have a tunable filter core which allows frequency tuning of the center frequency without changing the bandwidth. It is also possible to design the tunable filter core in such a manner that the band width is adjustable without changing the center frequency. A tunable filter core in which both the bandwidth and the position of the center frequency can be adjusted independently of one another is also possible.

The RF filter can be designed in such a manner that the filter core comprises filter segments with a parallel circuit and/or series interconnection of one electroacoustic resonator and one tunable impedance element each.

The tunable impedance element then serves to detune the electroacoustic resonator acoustically in such a manner that its resonant frequency is set to a desired value.

Conventional RF filters operating with electroacoustic components then comprise electroacoustic resonators, the resonant frequency of which define characteristic frequencies of a frequency band depending on the position of the circuit topology at which they are arranged. Thus, series resonators in ladder-like filter structures essentially determine the center frequency of a pass band with their resonant frequencies. The anti-resonant frequency of a series resonator essentially determines the position of the upper pass band edge whereas the resonance frequencies of parallel resonators essentially define the low-frequency edge of a pass band. The anti-resonant frequencies of the parallel resonators essentially correspond to the resonant frequencies of the series resonators.

If, in contrast, the anti-resonant frequencies of series resonators are selected to be similar to the resonant frequencies of the parallel resonators, a band-stop filter is obtained.

Analogously to the resonators of conventional electroacoustic filter circuits, the filter segments with a parallel circuit of an electroacoustic resonator and a tunable impedance element can replace a resonator in a conventional RF circuit in order to provide for adjustability of the characteristic frequencies.

It is also possible that the filter segments of the filter core comprise, in addition to the parallel circuit of one electroacoustic resonator and one tunable impedance element each, a further tunable impedance element which is connected in series with the parallel circuit. A filter segment thus comprises a tunable impedance element which is connected in parallel with the resonator, and a further tunable impedance element which is connected in series with the resonator. This improves the frequency-tunability of the resonator and thus of the filter segment in the filter core.

The tunable impedance elements of the RF filter circuit can be tunable inductive elements or tunable capacitive elements or—depending on requirement—both tunable impedance element and tunable capacitive elements. The implementation of a tunable capacitive element is generally simpler here if high-quality impedance elements are to be obtained. Tunable capacitive elements in this case can be varactors, tunable MEMs components or capacity banks with individual capacitors which can be added or disconnected.

It is possible that the filter segments are series elements or parallel elements or both of a ladder-type circuit. As already specified above, the use of a ladder-type circuit or of a ladder-like circuit in RF filters is normal since they are relatively power-tolerant and provide for low insertion loss with good selectivity—at least in a type of construction having few basic members.

It is possible that the impedance restoration circuits—that is to say either the first impedance restoration circuit or the second impedance restoration circuit or both impedance restoration circuits—comprise one admittance inverter each. An admittance inverter inverts a load admittance $Y_{load}$ and weights it with the square $J^2$ of the so-called value J of the admittance inverter according to the equation $Y_{in}=J^2/Y_{load}$ and thus provides an input admittance $Y_{in}$. Admittance inverter circuits can be implemented in many ways. By this means, the compensation for the impedance change can be achieved by tuning.

The one or the several impedance restoration circuits can comprise one or more tunable impedance elements for impedance restoration. In this context, tunable inductive elements, tunable capacitive elements or both tunable inductive elements and tunable capacitive elements can be present as tunable impedance elements in each impedance restoration circuit and suitably interconnected with one another. Since high-quality tunable capacitive elements can be easily implemented, the use of tunable capacitive elements in the impedance restoration circuits is preferred.

It is then possible that the impedance restoration circuits comprise a filter segment for impedance restoration, which is a serial impedance element, a parallel impedance element, an L circuit, a π circuit or a T circuit. By means of these individual impedance elements or combinations of impedance elements, impedance restoration structures having the functionality of an admittance inverter can be easily obtained.

It is possible that the impedance restoration circuits comprise impedance elements having adjustable capacity for impedance restoration, especially when high quality factors and simple selectability of the impedance elements are advantageous.

In a method for operating an RF filter tunable as, e.g., described above, the impedance restoration circuits have tunable impedance elements, the impedance of which is adjusted in such a manner that a change in an impedance is compensated for at an input or output of the tunable filter core.

For this purpose, there may be a logic circuit which is interconnected with the tunable impedance elements of the impedance restoration circuits via control lines.

It is possible that the impedance characteristic of the input and of the output of the tunable filter core is analyzed in advance. By means of the tunable impedance elements, the tunable filter core is adjusted in such a manner that preferred bandwidths and center frequencies and combinations of bandwidths and center frequencies are obtained. In this context, the input impedance and the output impedance of the tunable filter core are determined in each case.

Furthermore, nominal values are defined for the input impedance of the RF filter at the filter input and for the output impedance of the RF filter at the filter output. These can be, for example, 5 ohms, 25 ohms, 50 ohms, 100 ohms, 200 ohms or 500 ohms.

Subsequently, it is determined which impedance values or capacitive values are to be selected in the case of adjustable capacitive elements for the tunable impedance elements of the impedance restoration circuits so that the tunable RF filter presents itself towards the outside with the desired peripheral impedances defined in advance.

The corresponding parameters can also be stored in the logic circuit so that the values can be rapidly found.

As an alternative to this control of the tunable impedance elements, it is also possible to select an adaptive control of the tunable impedance elements so that, depending on the situation, optimum impedance connection values can always be obtained independently of whether certain pass band widths and/or center frequencies were already known in the development of the tunable RF filter, or not.

The tunable RF filter can then have additionally one or more impedance detectors which detect the corresponding input and output impedances of the RF filter and/or of the tunable filter core.

The electroacoustic resonators and impedance elements such as the tunable impedance elements or non-tunable impedance elements having constant impedance can be arranged and implemented in or on the same chip. However, it is also possible that the resonators and other impedance elements are distributed over various chips. The logic circuit and other circuit components of a control loop can also be arranged or implemented on or in one of these chips. Due to a correspondingly high degree of integration, the corresponding signal lines can be designed to be very short which favors the signal quality.

It is possible that the tunable RF filter operates as so-called diversity filter in a mobile communication device. As a diversity filter, it supports the signal reception and is exclusively provided for receiving RF signals but not to send them. As a result, the diversity filter does not need to be as power-resistant as, for example, transmitter filters. A single tunable diversity filter can replace a multiplicity of conventional diversity filters.

It is possible that the tunable RF filter is interconnected with a frequency-tunable power amplifier or with a low-noise amplifier (LNA). In principle, amplifiers such as power amplifiers or LNAs are better suited to operate with different frequencies. These amplifiers are, therefore, especially suitable for being interconnected with the filter which is also tunable in order to fulfill a multiplicity of different functions in a communication device having few circuit components.

It is also possible that such a tunable RF filter or two such tunable RF filters are interconnected in a duplexer. It is then possible to obtain a duplexer/tunable duplexer with low circuit expenditure while maintaining good electrical characteristics in a simple manner.

It is possible that such a duplexer can be used in a front-end module of a mobile communication device in order to replace a multiplicity of non-tunable duplexers. It is possible for even two or more receive and transmit signal bands arranged adjacently to one another to be covered, particularly if the tunability of the band width is large enough, so that a simultaneous operation in these different frequency bands is possible.

The tunable RF filter will be explained in greater detail in the text which follows by means of diagrammatic exemplary embodiments and diagrammatic figures, in which:

FIG. 1: shows an equivalent circuit with the essential circuit components of the tunable RF filter AHF, FIG. 2*a*: shows an equivalent circuit of the tunable RF filter in which the tunable filter core AFK has at least one parallel circuit of an impedance element and of an electroacoustic resonator, FIG. 2*b*: shows an equivalent circuit of the tunable RF filter in which the tunable filter core AFK has at least one series circuit of an impedance element and of an electroacoustic resonator, FIG. 3: shows an embodiment of the filter of FIG. 2 in which an impedance element is connected in series with the parallel circuit, FIG. 4*a*: shows an embodiment in which a tunable impedance element is implemented as parallel tunable capacitive element, FIG. 4*b*: shows an embodiment in which a tunable impedance element is implemented as serial tunable capacitive element, FIG. 5: shows an embodiment in which the series element of the filter segment is also implemented as tunable capacitive element, FIG. 6: shows an embodiment in which the tunable filter core has three filter segments interconnected in a T structure, FIG. 7: shows an embodiment in which the tunable filter core has a ladder-type structure, FIG. 8 to FIG. 17: show possible implementations of the admittance inverter, FIG. 18: shows three insertion losses for differently selected center frequencies of a conventional tunable RF filter, FIG. 19: shows three insertion losses for the three center frequencies of FIG. 18, but with impedance compensation.

FIG. 1 diagrammatically shows the structural configuration of the tunable RF filter AHF. The filter has a filter input FE and a filter output FA. Between these, the tunable filter core AFK is interconnected which essentially implements the filtering effect of the filter. The tunable filter core AFK has an input E and an output A. It has been found that the input impedance at input E and the output impedance at output A varies when the tunable filter core AFK is adjusted with respect to its center frequency or its bandwidth. The RF filter AFH, therefore, has a first impedance restoration circuit IWS1 between the filter input FE and the input of the tunable filter core AFK. By means of the first impedance restoration circuit IWS1, a defined input impedance of the RF filter AHF is achieved at the filter input FE, with the aid of which the filter can be easily interconnected with an external circuit environment. Analogously, the second impedance restoration circuit IWS2 between the output of the tunable filter core AFK and the filter output FA adjusts a desired predefined output impedance of the filter AHF at the filter output FA. Independently of how the input and output impedances of the tunable filter core AFK turn out in the tuning mode dependent on the individual case, the entire filter circuit AHF is always embedded with well defined impedance into an external circuit environment so that optimum signal forwarding is obtained. Especially, the insertion loss within the pass band is minimized and almost constant over the entire pass band range. The ripple in the pass band attains a very low level.

The individual relevant circuit points, the filter input, the filter output and the corresponding inputs and outputs of the impedance restoration circuits and of the tunable filter core are connected by signal lines SL. The signal lines and the subcircuits of the RF filter AHF can be designed in such a manner that balanced signals can be conducted. Forwarding of unbalanced signals is also possible.

FIG. 2a represents how the tunable filter core AFK obtains its tunability. The core comprises at least one electroacoustic component EAK. In parallel therewith, an impedance element IE is connected, the impedance of which is adjustable. Due to the fact that the impedance of the impedance element IE is adjustable, the acoustic of the electroacoustic component EAK is detunable as a result of which the filter core AFK becomes tunable.

FIG. 2b represents an alternative or additional option of obtaining tunability. The core comprises at least one electroacoustic component EAK and in series therewith an impedance element IE, the impedance of which is adjustable. Due to the fact that the impedance of the impedance element IE is adjustable, the acoustics of the electroacoustic component EAK are detunable as a result of which the filter core AFK becomes tunable.

The impedance elements IE of FIGS. 2a and 2b can be tunable inductive elements and, in particular, tunable capacitive elements.

FIG. 3 shows one form, wherein, in addition to the parallel interconnection of electroacoustic components EAK and impedance element IE, an additional impedance element IE is interconnected in series with the parallel interconnection. The impedance of the serial impedance element IE can also be adjustable here so that the tuning range of the filter core AFK is widened.

FIG. 4a shows how an electroacoustic component EAK and a tunable capacity element AKE, which constitutes the impedance element IE of FIG. 2, form a filter segment FS. Such or similar filter segments FS form the circuit elements of the tunable filter core AFK. The tunable filter core AFK can thus have series and parallel interconnections of corresponding filter segments FS.

FIG. 4b shows—analogously to FIG. 4a—a series interconnection of a tunable capacity element AKE with an electroacoustic resonator for detuning the resonator.

FIG. 5 shows an embodiment of a filter segment FS in which, in addition to the parallel interconnection of the tunable capacitive element AKE and the electroacoustic component EAK, a further tunable capacitive element AKE is interconnected in series in order to widen the tuning range and to achieve the flexibility on adjusting a center frequency and a bandwidth and particularly a good matching of the filter segments FS to one another.

FIG. 6 shows the equivalent circuit of important circuit elements of the RF filter, three filter segments FS being interconnected with one another in a T-arrangement in the tunable filter core AFK. In this arrangement, two filter segments are series-interconnected to one another in the signal branch between the two impedance restoration circuits. A third filter segment FS connects the coupling points of the two serial filter segments to ground. Even with this surprisingly simple combination of three filter segments in the filter core with the two impedance restoration circuits, a band pass filter can be obtained—as calculated in FIG. 19—which has an easily displaceable center frequency with almost constant band pass width and with good values for the insertion loss IL.

FIG. 7 shows important circuit elements of an embodiment in which the tunable filter core AFK has a ladder-type structure with three series-connected filter segments FS and three further filter segments FS which in each case connect the signal path to ground. In comparison with a topology of FIG. 6, the filter topology of this ladder-type circuit LDS in the tunable filter core AFK provides for even further optimization of the selection characteristics.

FIG. 8 shows a possible embodiment of one of the impedance restoration circuits with a tunable inductance. Direct interconnection of the impedance element of the impedance restoration circuit with ground is not necessary. Nevertheless, the impedance restoration circuits represent a two-port network.

Correspondingly, FIG. 9 shows an analog form of an impedance restoration circuit in which a tunable capacitive element is interconnected in the signal path.

In this context, the signal lines of the circuits of FIGS. 8 to 11 should also have a characteristic impedance $Z_0$ and produce a phase rotation in an angle $\Phi$. The phase rotation can be divided here into two rotations, e.g. by $\Phi/2$ in each case. The specific values of $\Phi$ and $Z_0$ depend on the topologies of the remaining circuit segments here and can be easily determined by the usual technical measures. Thus, $\Phi$ should be selected in such a manner that all part-signals can be combined in the correct phase. $Z_0$ is obtained from the impedance matching factor.

Figure 12:
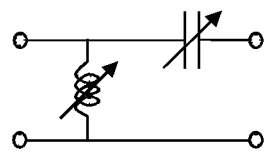

FIG. 12 shows a possible embodiment of an impedance restoration circuit in which a tunable capacitive element in the signal branch and a tunable inductive element between the signal branch and ground together form an L structure.

Figure 13:
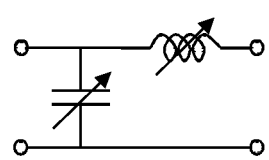

FIG. 13 also shows an embodiment of an impedance restoration circuit in L-form in which a tunable inductive element, and connected in parallel therewith, between the signal branch and ground, a tunable capacitive element are arranged in the signal branch.

The capacitance values and inductance values, respectively, of the impedance elements are specified by the condition $Y_{in}=J^2/Y_{load}$.

Figure 14:
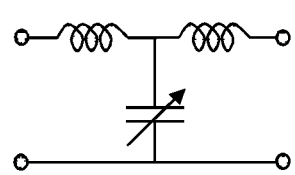

FIG. 14 shows an embodiment of the impedance restoration circuit in T-form, two inductive elements being connected in series in the signal branch whilst a tunable capacitive element connects the signal branch to ground.

Figure 15:
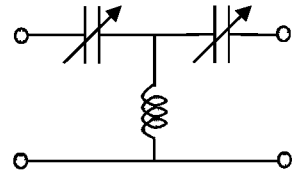

FIG. 15 also shows an embodiment of an impedance restoration circuit in T-form, two tunable capacitive elements being interconnected in series in the signal branch and an inductive element connecting the signal branch to ground.

Figure 16:
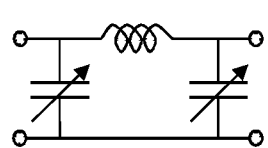

FIG. 16 shows an embodiment of an impedance restoration circuit in π form, an inductive element being interconnected in the signal branch and a tunable capacitive element in each case connecting the input or output of the circuit to ground.

Figure 17:
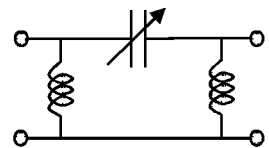

Correspondingly, FIG. 17 shows an embodiment of an impedance restoration circuit in n-form, a tunable capacitive element being interconnected in the signal branch whereas an inductive element is connected in each case to each of the ports of the circuit.

Each of the two impedance restoration circuits which are selected from first impedance restoration circuit and second impedance restoration circuit can comprise one or more of the embodiments of FIGS. 8 to 17 and possibly also further circuit or impedance matching elements. The tunable elements are preferably capacitive elements. The use of tunable inductive elements instead of or in addition to tunable capacitive elements is also possible.

Figure 18:
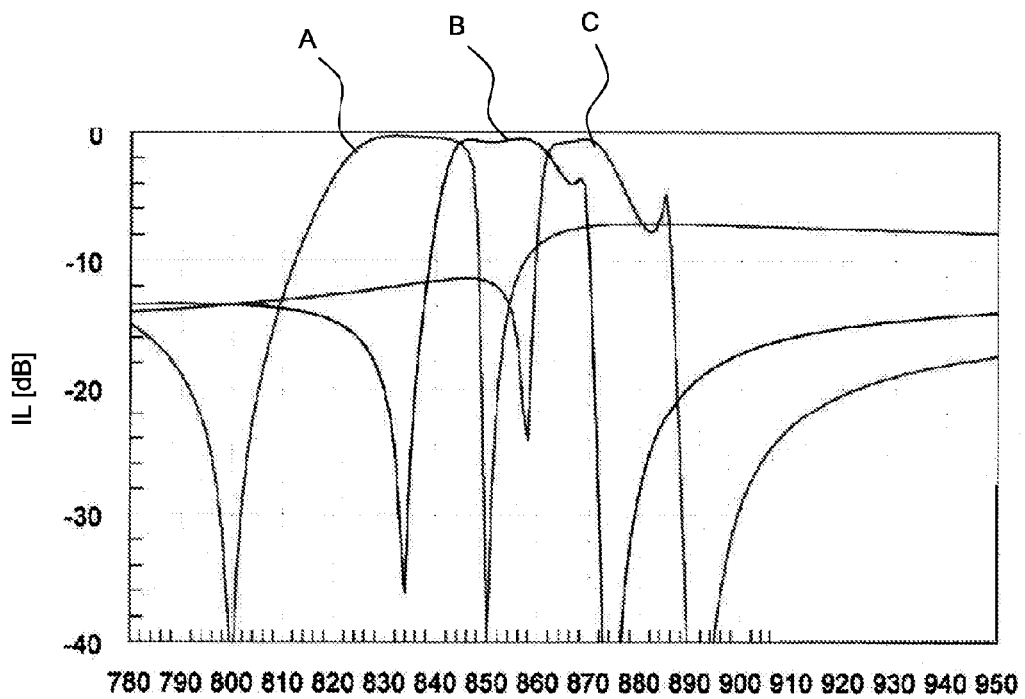
Figure 19:
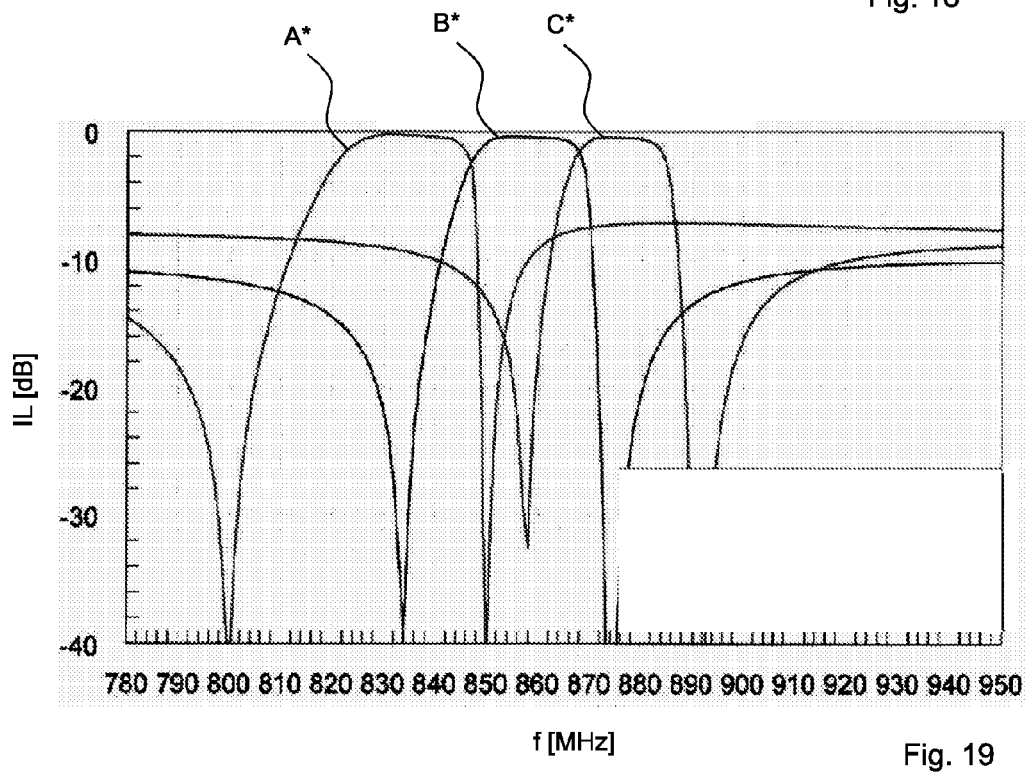

The effect of the combination of impedance restoration circuit and tunable filter core is clearly illustrated by FIGS. 18 and 19: FIG. 18 shows the frequency-dependent insertion loss of conventional tunable filter circuits which operate with electroacoustic components. Curves A, B and C have pass bands here which can be displaced in their center frequencies by detuning the electroacoustic components by tunable capacitive elements. In this context, both the form of the insertion losses within and outside the pass band and the width of the pass band and particularly the ripple in the pass band change. Thus, the actually usable pass band width decreases clearly with increasing displacement towards higher frequencies since—compare curve C—a constriction clearly forms in the area of small insertion losses on the side of the upper pass band edge but the insertion loss after that is reduced again until it finally rises in the direction of one pole position.

Figure 1:
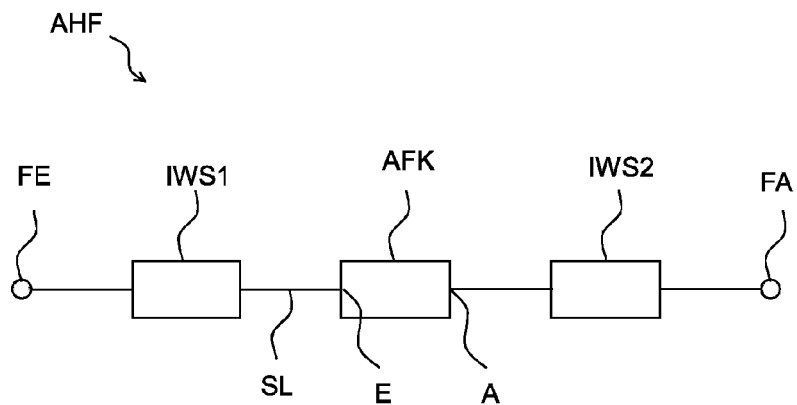
Figure 2A:
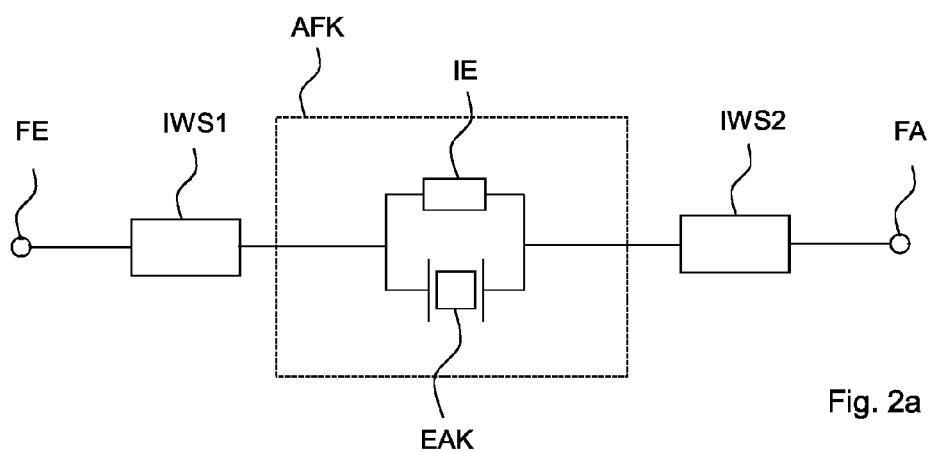
Figure 2B:
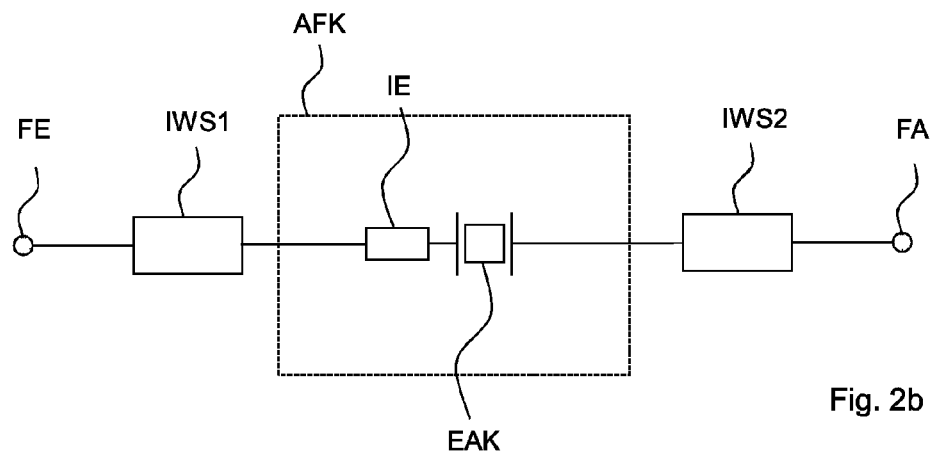
Figure 3:
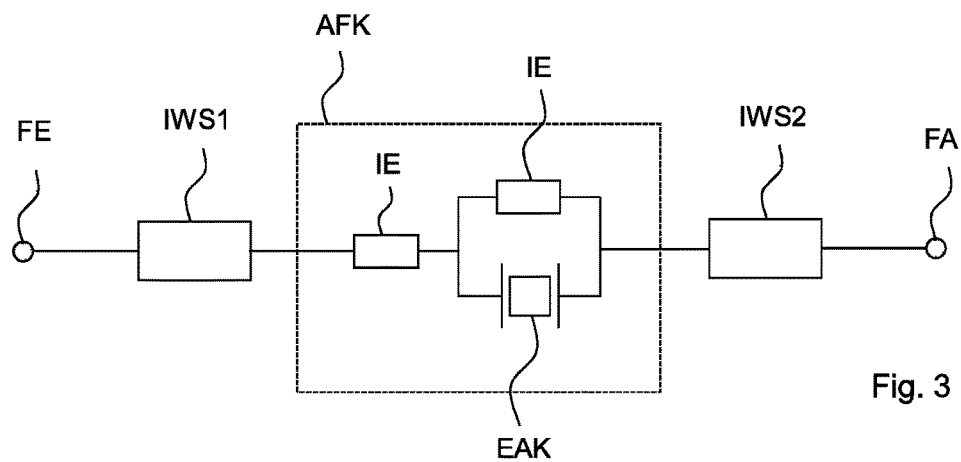
Figure 4A:
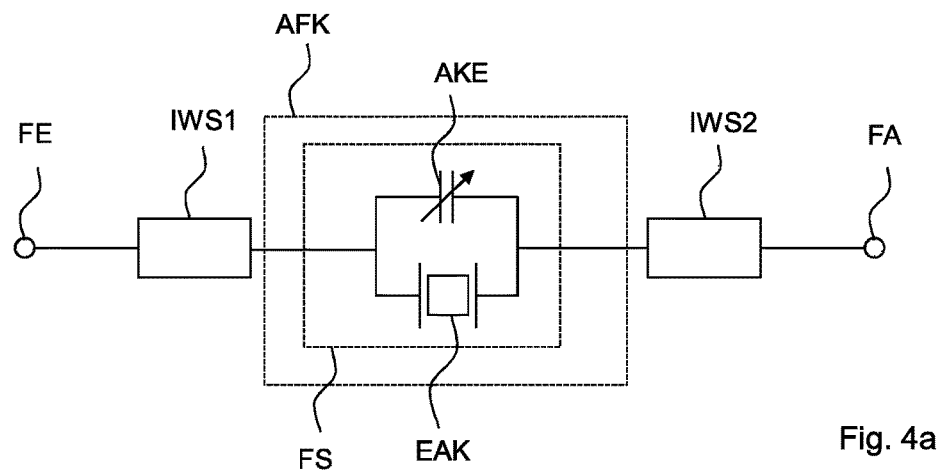
Figure 4B:
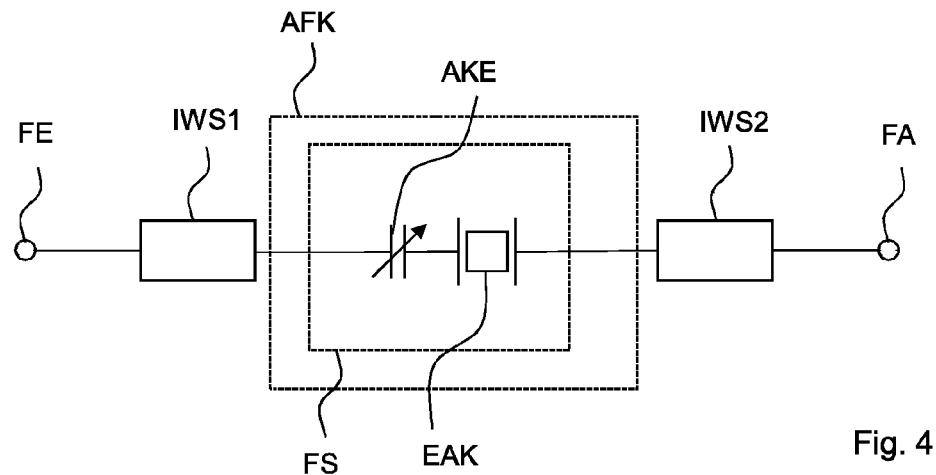
Figure 5:
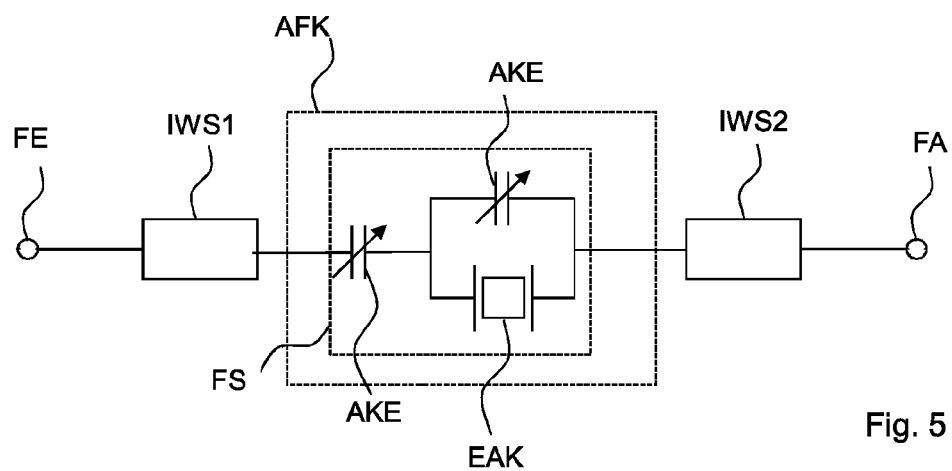
Figure 6:
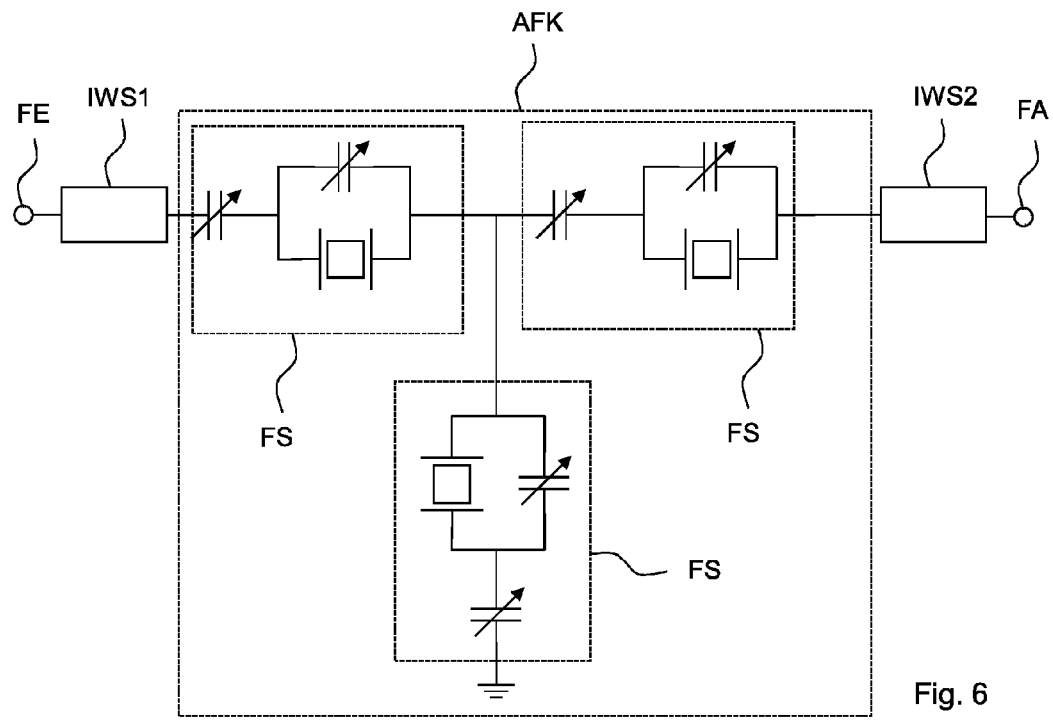
Figure 7:
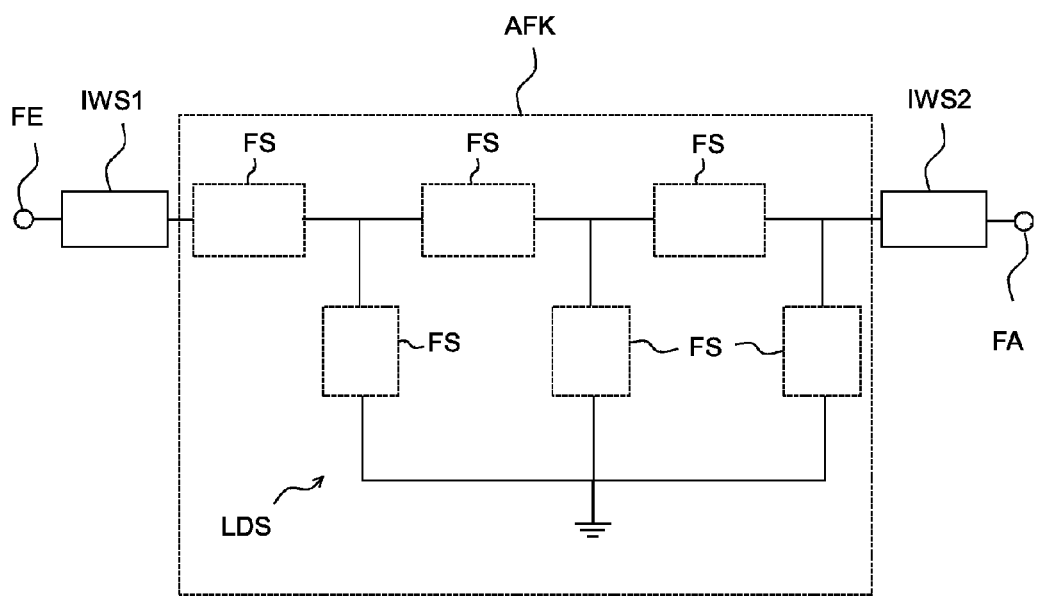
Figure 8:
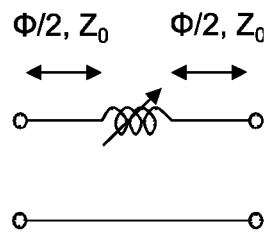
Figure 9:
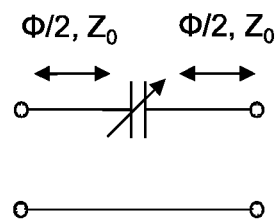
Figure 10:
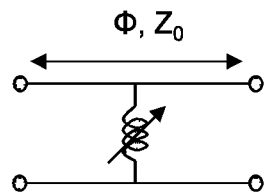
FIG. 10 shows an embodiment of an impedance restoration circuit in which a tunable inductive element connects the signal branch to ground (shown by the lower signal line).
Figure 11:
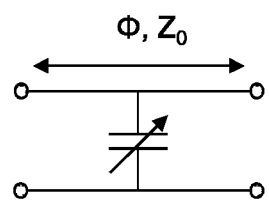
FIG. 11 shows an analog embodiment in which the tunable inductive element is replaced by a tunable capacitive element which connects the signal path to ground.

In contrast thereto, FIG. 19 shows the variation of the three insertion losses A*, B*, C* which is based on a topology of the combination, shown in FIG. 6, of filter core and impedance restoration circuits. Although the pass band width decreases towards higher center frequencies, the distortion of the structure of the variation of the insertion loss within the pass band has almost disappeared, in contrast, and the ripple pass bands have well defined widths and well defined edges.

The tunable RF filter and the described methods for operating tunable RF filters are not restricted to the exemplary embodiments shown or described. RF filters with further circuit components in the filter core which implement a defined filtering effect or other passive or even active circuit elements in at least one of the impedance restoration circuits also belong to the embodiments shown.

LIST OF REFERENCE DESIGNATIONS

A*, B*, C*: Insertion losses of an RF filter with impedance restoration circuits
A, B, C: Insertion losses of conventional tunable filters
A: Output of the tunable filter core
AFK: Tunable filter core
AHF: Tunable RF filter
AKE: Tunable capacitive element
E: Input of the tunable filter core
EAK: Electroacoustic component
f: Frequency
FA: Output of the RF filter
FE: Input of the RF filter
FS: Filter segment
IE: Impedance element
IL: Insertion loss
IWS1: First impedance restoration circuit
IWS2: Second impedance restoration circuit
LDS: Ladder-type structure
SL: Signal line

The invention claimed is:

1. A tunable radio frequency (RF) filter comprising:
a filter input;
a filter output;
a tunable filter core comprising an input, an input impedance, an output, an output impedance, and electroacoustic filter elements between the input and the output;
a first impedance restoration circuit electrically connected between the filter input and input of the filter core, wherein the first impedance restoration circuit is configured to compensate for a first impedance change, induced by tuning the tunable filter core, of the input impedance of the filter core; and
a second impedance restoration circuit electrically connected between the output of the filter core and the filter output, wherein the second impedance restoration circuit is configured to compensate for a second impedance change, induced by tuning the tunable filter core, of the output impedance of the filter core,
wherein each of the first and second impedance restoration circuits comprises at least one admittance inverter.

2. The RF filter according to claim 1, wherein the filter core comprises filter segments having at least one of a parallel circuit of one electroacoustic resonator and one tunable impedance element each or a series interconnection of one electroacoustic resonator and one tunable impedance element each.

3. The RF filter according to claim 2, wherein the tunable impedance elements are tunable capacitive elements.

4. The RF filter according to claim 3, wherein the filter segments are series elements or parallel elements of a ladder-type circuit.

5. The RF filter according to claim 1, wherein the filter core comprises filter segments with series circuits of one tunable impedance element each interconnected in series with a parallel circuit of one electroacoustic resonator and one tunable impedance element each.

6. The RF filter according to claim 5, wherein the tunable impedance elements are tunable capacitive elements.

7. The RF filter according to claim 5, wherein the filter segments are series elements or parallel elements of a ladder-type circuit.

8. The RF filter according to claim 1, wherein the impedance restoration circuits comprise one or more tunable impedance elements for impedance restoration.

9. The RF filter according to claim 1, wherein the first and second impedance restoration circuits comprise a filter segment for impedance restoration, which is selected from: a serial impedance element, a parallel impedance element, an L circuit, a π circuit, and T circuit.

10. The RF filter according to claim 1, wherein the first and second impedance restoration circuits comprise impedance elements having an adjustable capacitance for impedance restoration.

11. The RF filter according to claim 1, the RF filter configured as a band pass filter.

12. The RF filter according to claim 1, wherein the electroacoustic filter elements are configured to use acoustic waves.

13. The RF filter according to claim 1, wherein the RF filter is configured as a band pass filter and the electroacoustic filter elements are configured to use acoustic waves.

14. A method for operating a tunable radio frequency (RF) filter having a tunable filter core, a first impedance restoration circuit, and a second impedance restoration circuit, the method comprising:
tuning the tunable filter core to displace a pass band;
compensating, using the first restoration circuit electrically connected to an input of the tunable filter core and comprising at least one first admittance inverter, for a first impedance change, induced by tuning the tunable filter core, of an input impedance of the tunable filter core; and
compensating, using the second restoration circuit electrically connected to an output of the tunable filter core and comprising at least one second admittance inverter, for a second impedance change, induced by tuning the tunable filter core, of an output impedance of the tunable filter core.

\* \* \* \* \*